(12) United States Patent
Martchevskii

(10) Patent No.: US 8,218,272 B2
(45) Date of Patent: Jul. 10, 2012

(54) EARLY QUENCH DETECTION IN A SUPERCONDUCTING ARTICLE

(75) Inventor: Maxim Martchevskii, Houston, TX (US)

(73) Assignee: Superpower, Inc., Schenectady, NY (US)

( * ) Notice: Subject to any disclaimer, the term of this patent is extended or adjusted under 35 U.S.C. 154(b) by 762 days.

(21) Appl. No.: 12/418,664

(22) Filed: Apr. 6, 2009

(65) Prior Publication Data
US 2010/0254047 A1    Oct. 7, 2010

(51) Int. Cl.
*H02H 7/00* (2006.01)
(52) U.S. Cl. .......................................................... 361/19
(58) Field of Classification Search ...................... 361/19
See application file for complete search history.

(56) References Cited

U.S. PATENT DOCUMENTS

| | | | | |
|---|---|---|---|---|
| 5,179,072 | A * | 1/1993 | Bluzer | 505/160 |
| 6,960,914 | B2 * | 11/2005 | Shen et al. | 324/319 |
| 7,064,550 | B2 * | 6/2006 | Shen | 324/319 |
| 7,071,148 | B1 | 7/2006 | Selvamanickam et al. | |
| 7,365,271 | B2 | 4/2008 | Knoll et al. | |
| 7,728,707 | B2 * | 6/2010 | Gilardi et al. | 335/296 |
| 2005/0139380 | A1 | 6/2005 | Knoll et al. | |
| 2006/0773977 | | 4/2006 | Xie et al. | |

OTHER PUBLICATIONS

J.H. Shultz, "Superconducting Magnets, Quench Protection", Wiley Encyclopedia of Electrical and Electronics Engineering, pp. 1-27 (1999).
B. Seeber, Handbook of Applied Superconductivity, pp. 542-543 (1998).
Trillaud et al., "Protection and Quench Detection of YBCO Coils. Results with Small Test Coil Assemblies", IEEE Trans. Appl. Superconductivity, vol. 17, No. 2, pp. 2450-2453 (Jun. 2007).
Oberley et al., "Improved Dielectric Materials for Passive Quench of High Temperature Superconductors", presented at the International Cryogenic Materials Conference, Keystone, Colorado, Paper No. M2-L-04, 1 page (Aug. 29-Sep. 2, 2005).
Bai et al., "Quench Propagation Properties Analysis of High-Temperature Superconductors Using Finite Element Method", Physica C, 436, pp. 99-102 (2006).

* cited by examiner

*Primary Examiner* — Stephen W Jackson
(74) *Attorney, Agent, or Firm* — Kevin P. Radigan, Esq.; Heslin Rothenberg Farley & Mesiti P.C.

(57) ABSTRACT

A superconducting article is provided which incorporates an early quench detection facility. The superconducting article includes a first superconductive segment and a second superconductive segment, along with a magnetic field sensor(s). The magnetic field sensor(s) is disposed to monitor relative change in strength of a net magnetic field generated by a first current passing through the first superconductive segment and a second current passing through the second superconductive segment. A relative change in strength of the net magnetic field indicates degradation of a critical quench current of the first superconductive segment or the second superconductive segment, caused for example, by formation of one or more hot-spots or quench regions in the first or second superconductive segment. The indication of degradation is thus obtained prior to complete superconductive segment quenching.

21 Claims, 14 Drawing Sheets

EARLY QUENCH DETECTION IN A SUPERCONDUCTING ARTICLE

TECHNICAL FIELD

The present invention relates in general to superconducting articles, and in particular, to superconducting articles and methods of fabrication thereof with quench detection. More particularly, the present invention relates to superconducting articles comprising a high-temperature superconductor (HTS) with a detection facility for early detection of degradation of a superconducting characteristic(s) of the HTS conductor.

BACKGROUND OF THE INVENTION

Superconductor materials have long been known and understood by the technical community. Low-temperature (low-$T_c$) superconductors exhibiting superconductive properties at temperatures requiring use of liquid helium (4.2° K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77° K) was discovered, namely $YBa_2Cu_3O_{7-x}$ (YBCO), followed by development of additional materials over the past 15 years, including $Bi_2Sr_2Ca_2Cu_3O_{10+y}$ (BSCCO), and others. The development of high-$T_c$ superconductors has brought potentially, economically feasible development of superconductors utilizing liquid nitrogen, rather than the comparatively more expensive cryogenic infrastructure based on liquid helium.

A great deal of interest has been generated in the so-called second-generation HTS conductors that have superior commercial viability. These conductors typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal.

Commercial availability and consistent, gradual improvements in second-generation superconducting conductors opens up new application areas for HTS conductors. One such promising application involves high-field magnets operating at above-helium, and potentially, at a liquid nitrogen temperature. Effective prevention of quenches in these devices is an important reliability factor. Unlike low-$T_c$ superconductors, the HTS conductor is less prone to quenching. This is primarily due to a combination of much higher specific heat of the HTS conductor at operating conditions, and a less steep I-V characteristic (lower n-value) compared to the low-$T_c$ counterparts. At the same time, whenever quench in HTS conductors occurs, its detection and management presents a serious engineering problem. The same factors that suppress quench occurrence result in very slow development of thermal instability and inhibiting of its propagation along the HTS conductor. Normal zone propagation velocity reported for a practical second generation superconductor is in the range of 0.1-1 cm/s, which is $10^3$-$10^4$ times less than in a low-$T_c$ superconductor. Slow developing thermal instability means that initially a small local hot-spot (or quench region) is formed in the wire, and significant heating can occur there prior to the surrounding region quenching to the normal resistive state of the conductor. This leads to a quick local degradation of the YBCO material due to oxygen loss or due to complete conductor burn-out. At the same time, voltage associated with formation of one or more localized hot-spots is always small, proportional to the hot-spot dimensions, which makes it hard to detect the quench signal in the background of voltage noise.

A number of active and passive approaches to the quench detection problem have been proposed. They include active solutions, such as individual voltage monitoring in magnet sub-sections (see, e.g., J. H. Schultz, "Superconducting Magnets, Quench Protection", Wiley Encyclopedia of Electrical and Electronics Engineering, pp. 1-27 (1999); and B. Seeber, Handbook of Applied Superconductivity, pp. 542-543 (1998)) and acoustic noise detection (see, e.g., Trillaud et al., "Protection and Quench Detection of YBCO Coils. Results with Small Test Coil Assemblies", IEEE Trans. Appl. Superconductivity, Vol. 17, No. 2, pp. 2450-2453 (June 2007)) and passive ones, such as the use of a material with high-heat capacity (diamond, sapphire) or a switching dielectric-conductor material (ZnO) as a surrounding shell between the neighboring turns of the magnet wire (see, e.g., Oberley et al., "Improved Dielectric Materials for Passive Quench of High Temperature Superconductors", presented at the International Cryogenic Materials Conference, Keystone, Colo., Paper No. M2-L-04, (Aug. 29-Sep. 2, 2005)). Also, complex active detection techniques based on 3-D computer modeling of the thermal response are being developed (see, e.g., Bai et al., "Quench Propagation Properties Analysis of High-Temperature Superconductors Using Finite Element Method", Physica C, 436, pp. 99-102 (2006)).

Notwithstanding the above, a need continues to exist in the superconducting art, and in particular, in the art of second generation HTS conductors, for provision of commercially viable conductors, methods of fabrication, and articles utilizing the same which incorporate an early quench detection facility.

SUMMARY OF THE INVENTION

Accordingly, in one aspect, the present invention comprises a superconducting article which includes a first superconductive segment, a second superconductive segment, and at least one magnetic field sensor. The at least one magnetic field sensor is disposed to monitor relative change in strength of a net magnetic field comprising a first magnetic field generated by a first current passing through the first superconductive segment superposed with a second magnetic field generated by a second current passing through the second superconductive segment. A relative change in strength of the net magnetic filed indicates degradation of at least one superconducting characteristic of one of the first superconductive segment or the second superconductive segment.

In another aspect, a superconducting article is provided which includes a plurality of superconductive segments and at least one magnetic field sensor. The at least one magnetic field sensor is disposed to monitor relative change in strength of magnetic fields generated by current passing through respective superconductive segments of the plurality of superconductive segments. A relative change in magnetic field strength of one superconductive segment compared with at least one other superconductive segment indicates degradation of at least one superconducting characteristic of the one superconductive segment or the at least one other superconductive segment.

In a further aspect, a method of fabricating a superconducting article is provided. The method includes: forming a superconducting conductor comprising a first superconductive segment in spaced, opposing relation to a second superconductive segment, with a gap defined therebetween; and disposing at least one magnetic field sensor adjacent to the superconducting conductor to monitor relative change in strength of a net magnetic filed comprising a first magnetic field generated by a first current passing through the first superconductive segment superposed with a second magnetic field generated by a second current passing through the second superconductive segment, wherein relative change in strength of the net magnetic field indicates degradation of at least one superconducting characteristic of one of the first superconductive segment or the second superconductive segment.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
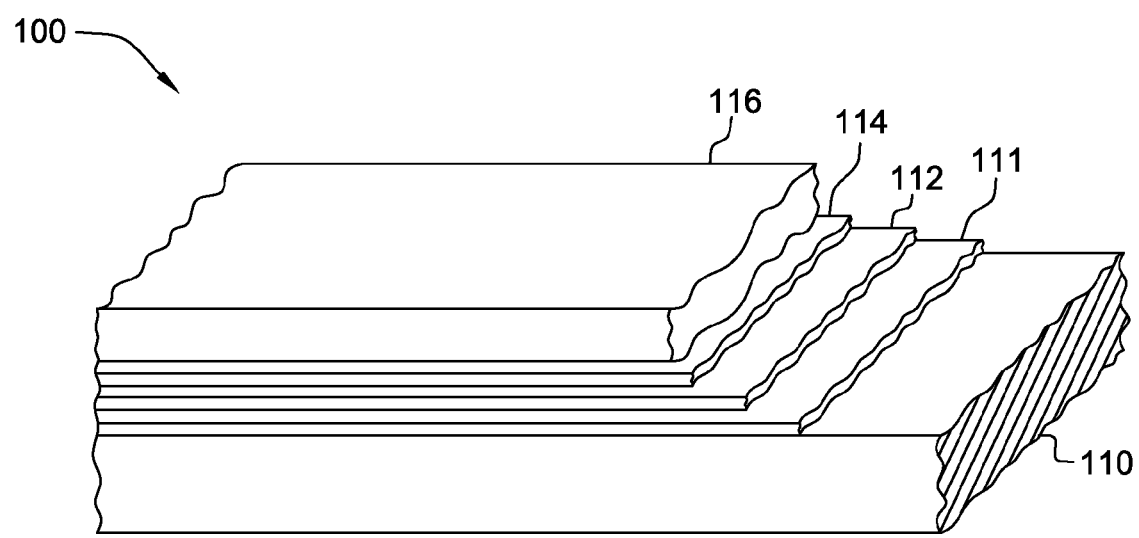
FIG. 1 illustrates one embodiment of a high-temperature superconducting (HTS) conductor which may be modified for use in a superconducting article, in accordance with an aspect of the present invention.

Referring to FIG. 1, the general layered structure of an HTS conductor 100 is depicted which can be employed in a superconducting article, in accordance with the present invention. The HTS conductor 100 includes a substrate 110, a buffer layer 111 overlying substrate 110, an HTS layer 112, followed by a capping layer 114, (typically a noble metal layer) and a stabilizer layer 116 (typically a non-noble metal). In the embodiment depicted in FIG. 1, buffer layer 111, HTS layer 112, capping layer 114 and stabilizer layer 116 are collectively referred to as the superconducting region, which as illustrated, is disposed along one main surface of substrate 110. Note that in a fault current limiter application of a superconducting article such as described herein, stabilizer layer 116 would be omitted, with the superconducting region comprising buffer layer 111, HTS layer 112, and capping layer 114.

The substrate 110 is typically in a tape-like configuration, having a high aspect ratio. For example, the width of the tape is generally on the order of about 2-12 mm, and the length of the tape is typically at least about 100 m, most typically greater than about 500 m. Accordingly, the substrate may have an aspect ratio which is fairly high, on the order of not less than $10^3$, or even not less than $10^4$. Certain embodiments are longer, having an aspect ratio of $10^5$ and higher. As used herein, the term 'aspect ratio' is used to denote the ratio of the length of the substrate or tape to the next longest dimension, that is, the width of the substrate or tape.

In one embodiment, the substrate is treated so as to have desirable surface properties for subsequent deposition of the constituent layers of the HTS tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to buffer layer 111, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is an acronym for Ion Beam Assisted Deposition, a technique which may be advantageously utilized to form a suitably textured buffer layer for subsequent formation of an HTS layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, which is incorporated herein by reference in its entirety.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and silicon carbide. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconducting layer exists. Accordingly, the buffer layer may further include another buffer film, this one in particular implemented to reduce a mismatch in lattice constants between the HTS layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

High-temperature superconductor (HTS) layer 112 is typically chosen from any of the high-temperature superconducting materials that exhibit superconducting properties above the temperature of liquid nitrogen, 77° K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The HTS layer 112 may be formed by anyone of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the HTS layer has a thickness on the order of about 1 to about 30 microns, most typically about 2 to about 20 microns, such as about 2 to about 10 microns, in order to get desirable amperage ratings associated with the HTS layer 112.

Capping layer 114 and stabilizer layer 116 are generally implemented for electrical stabilization, that is, to aid in prevention of HTS burnout in practical use. More particularly, layers 114 and 116 aid in continued flow of electrical charges along the HTS conductor in cases where cooling fails or the critical current density is exceeded, and the HTS layer moves from the superconducting state and becomes resistive. Typically, a noble metal is utilized for capping layer 114 to prevent unwanted interaction between the stabilizer layer(s) and the HTS layer 112. Typical noble metals include gold, silver, platinum, and palladium. Silver is typically used due to its cost and general accessibility. Capping layer 114 is typically made to be thick enough to prevent unwanted diffusion of the components from stabilizer layer 116 into HTS layer 112, but is made to be generally thin for cost reasons (raw material and processing costs). Typical thicknesses of capping layer 114 range within about 0.1 to about 10.0 microns, such as 0.5 to about 5.0 microns. Various techniques may be used for deposition of capping layer 114, including physical vapor deposition, such as DC magnetron sputtering.

Depending on the implementation, stabilizer layer 116 is incorporated to overlie the superconducting layer 112, and in particular, overlie and directly contact capping layer 114 in the embodiment shown in FIG. 1. Stabilizer layer 116 functions as a protection/shunt layer to enhance stability against harsh environmental conditions and superconductivity quench. The layer is generally dense and thermally and electrically conductive, and functions to bypass electrical current in case of failure in the superconducting layer. Conventionally, such layers have been formed by laminating a preformed copper strip onto the superconducting tape, by using an intermediary bonding material such as a solder or flux. Other techniques have focused on physical vapor deposition, typically, sputtering. However, such application techniques are costly, and not particularly economically feasible for large-scale production operations. According to a particular feature of the embodiment, stabilizer layer 116 is formed by electroplating. According to this technique, electroplating can be used to quickly build-up a thick layer of material on the superconducting tape, and it is a relatively low cost process that can effectively produce dense layers of thermally and electrically conductive metals. According to one feature, the stabilizer layer is deposited without the use of or reliance upon and without the use of an intermediate bonding layer, such as a solder layer (including fluxes) that have a melting point less than about 300° C.

Electroplating (also known as electrodeposition) is generally performed by immersing the superconductive tape in a solution containing ions of the metal to be deposited. The surface of the tape is connected to an external power supply and current is passed through the surface into the solution, causing a reaction of metal ions ($M^{z-}$) with electrons ($e^-$) to form a metal (M), wherein:

$$M^{z-}+ze^-=M$$

Capping layer 114 functions as a second layer for deposition of copper thereon. In the particular case of electroplating of stabilizer metals, the superconductive tape is generally immersed in a solution containing cupric ions, such as in a copper sulfate solution. Electrical contact is made to capping layer 114 and current is passed such that the reaction $Cu^{2+}+2e^- \rightarrow Cu$ occurs at the surface of capping layer 114. The capping layer 114 functions as the cathode in the solution, such that the metal ions are reduced to Cu metal atoms and deposited on the tape. On the other hand, a copper-containing anode is placed in the solution, at which an oxidation reaction occurs such that copper ions go into solution for reduction and deposition at the cathode.

In the absence of any secondary reactions, the current delivered to the conductive surface during electroplating is directly proportional to the quantity of metal deposited (Faraday's Law of Electrolysis). Using this relationship, the mass, and hence thickness of the deposited material forming stabilizer layer 116 can be readily controlled.

While the foregoing generally references copper, it is noticed that other metals, including aluminum, silver, gold, and other thermally and electrically conductive metals may also be utilized. However, it is generally desirable to utilize a non-noble metal to reduce overall materials cost for forming the superconductive tape.

While the foregoing description and FIG. 1 describes electroplating to form stabilizer layer 116 along one side of the superconductive tape, it is also noted that the opposite, major side of the superconductive tape may also be coated, and indeed, the entirety of the structure can be coated so as to be encapsulated. Those skilled in the art will note that the above-description of HTS conductor 100 in FIG. 1 is provided by way of example only. The superconducting articles described hereinbelow may utilize any appropriate superconducting conductor. For example, and as noted, a fault current limiter application of a superconducting article such as described below would omit stabilizer layer 116.

Figure 2:
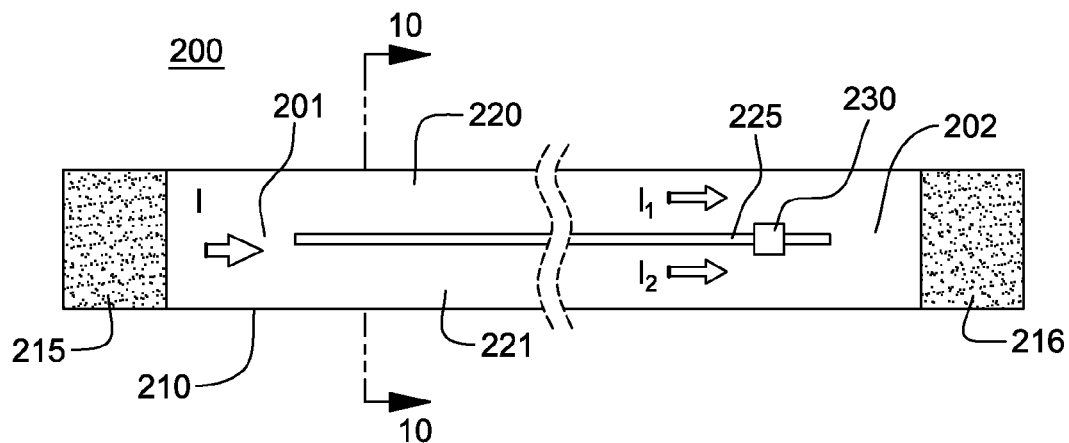
FIG. 2 is a plan view of one embodiment of a superconducting article comprising a superconducting conductor and a magnetic field sensor, in accordance with an aspect of the present invention.

Generally stated, disclosed herein is a novel technique for early detection of degradation of one or more superconducting characteristics of a superconducting conductor, such as an HTS conductor employed in a 2G superconductor-based coil or magnet. Unlike other solutions, the techniques described herein take advantage of the localized nature of quench regions (i.e., hot-spots) and their slow temporal evolution, in order to achieve a high-detection sensitivity. One embodiment of a superconducting article, generally denoted 200, in accordance with an aspect of the present invention, is depicted in FIG. 2.

As illustrated, superconducting conductor 210 of superconducting article 200 is sub-divided by an elongate gap (or slit) 225 through a portion thereof, which defines a first superconductive segment 220 and a second superconductive segment 221 of equal width extending for a substantial portion of the conductor. In this embodiment, the elongate gap does not extend the entire length of the conductor to leave a first superconductive bridge section 201 and a second superconductive bridge section 202 disposed at the ends of the superconducting conductor adjacent to a first current lead 215 and a second current lead 216. As illustrated, first superconductive bridge section 201 and second superconductive bridge section 202 are bridging areas where the full current I through the superconducting conductor flows. This full current I is sub-divided into a first current $I_1$ passing through first superconductive segment 220, and a second current $I_2$ passing through second superconductive segment 221. Because the superconductive segments are of equal width (in this example), the first and second currents $I_1$ and $I_2$ are equal when the segments are in superconducting state. Formation of equal width segments can be accomplished using a number of techniques. For example, mechanical slitting, indentation using a sharp knife, dry or chemical etching or other techniques might be employed to form the longitudinal gap in the superconducting conductor. The superconducting article further includes one or more magnetic field sensors 230, such as a Hall probe, with an active area of, for example, ~0.05 mm² positioned (in this embodiment) over the gap between the spaced superconductive segments and, facing the superconducting conductor surface.

Figure 3A:
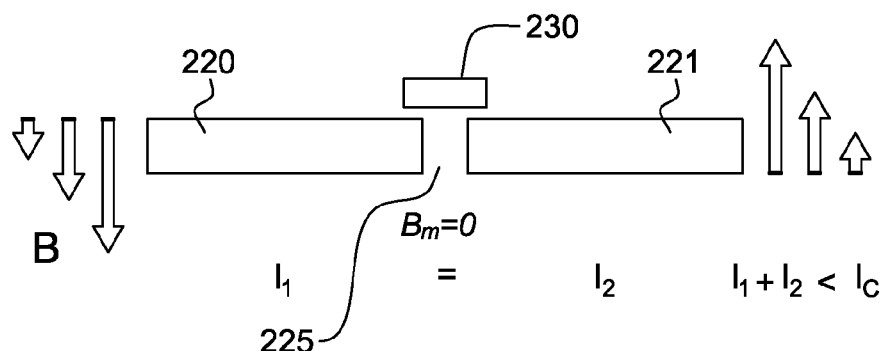
FIG. 3A is a cross-sectional representation of the superconducting article of FIG. 2, wherein equal currents are flowing through the superconductive segments, in accordance with an aspect of the present invention.

As illustrated in FIG. 3A, the equal currents through superconductive segments 220 & 221 create magnetic fields (B) around the segments and around the conductor. This field is strongest at the conductor edges where it is also directed almost normal to the conductor surface. However, inside the elongate gap, the normal field components fully compensate along the middle line of the gap due to corresponding components of the two currents in the first and second superconductive segments being equal in magnitude and opposite in direction.

Localized external heat flux, poor heat exchange, material imperfections, or physical damage to one or more of the superconductive segments along the conductor may result in localized reduction of the critical current density, or more generally, degradation of one or more superconducting characteristics of the conductor. This reduction in critical current density (or degradation of superconductive characteristic(s)) is a common cause of quench region (i.e., hot-spot) formation.

Figure 3B:
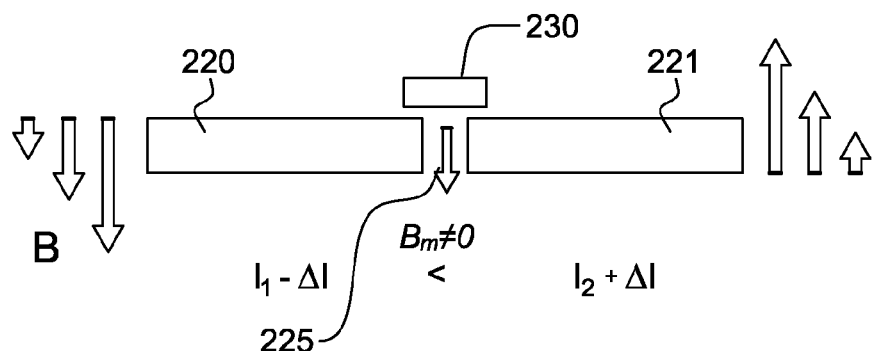
FIG. 3B depicts the cross-sectional representation of FIG. 3A wherein unequal currents flow through the superconductive segments, and where a relative change in strength of a magnetic field is detected, which is indicative of degradation of one or more superconducting characteristics of one of the superconductive segments, for example, due to formation of one or more quench regions (or hot-spots) in the one superconductive segment, in accordance with an aspect of the present invention.

Slow thermal relaxation and non-uniform distribution of defects makes simultaneous formation and subsequent synchronization (equal within a few milliseconds of one another) growth of normal, resistive state regions in the two segments of the conductor highly unlikely. As the critical current ($I_c$) of one segment is reduced for any reason, the excess current flows in the other segment. This current redistribution occurs at the same time that the critical current I reduction develops and it precedes appearance of a voltage across the superconducting conductor. This current redistribution produces an unbalanced, out-of-plane magnetic field ($B_m$) in the gap region between the two segments, as illustrated in FIG. 3B. As disclosed herein, this non-zero, magnetic field ($B_m$) in gap 225 between first superconductive segment 220 and second superconductive segment 221 is readily detectable with a magnetic field sensor 230, placed at a convenient point over the middle line of the conductor, for instance, near one end of the conductor, as illustrated in FIG. 2.

A simple estimate of the magnetic field change due to current redistribution in a practical conductor configuration can be made using the expression for the field at a distance y from the middle line of the current-carrying strip, that is:

$$H(y) = \frac{I_c}{2a\pi} \text{ArcTanh}\left[\frac{a^2 - b^2}{y^2 - b^2}\right]^{1/2}, |y| > a \quad (1)$$

where 2a is the strip width, $I_c$ is the critical current and $b = a(1 - I^2/I_c^2)^{1/2}$.

For simplicity, magnetic interaction between the parts is neglected and an assumption is made that the net field in the middle of the gap $H_m$ is simply a superposition of the two individual contributions, which yields equation (2) below.

$$H_m = \frac{I_c}{2a\pi}\left(\text{ArcTanh}\left[\frac{a^2 - b_1^2}{(a+w)^2 - b_1^2}\right]^{1/2} - \text{ArcTanh}\left[\frac{a_2^2 - b_2^2}{(a+w)^2 - b_2^2}\right]^{1/2}\right) \quad (2)$$

where 2w is the width of the gap, $b_1 = a(1 - I_1^2/I_c^2)^{1/2}$ and $b_2 = a(1 - I_2^2/I_c^2)^{1/2}$.

Here, the same $I_c$ is used for both terms, assuming that the field is sensed in the tape area outside of the article or device winding, where quench occurrence is least likely and field penetration is dependent only upon the magnitude of the transport current. This also implies that only self-field is present at that location.

As w<<a, $$\text{ArcTanh}(x) = \frac{1}{2}\ln\left(\frac{1+x}{1-x}\right)$$

can be used, which after simplifying, results in:

$$H_m = \frac{I_c}{4a\pi}\left[\ln\left(\frac{2(a^2 - b_1^2)}{aw}\right) - \ln\left(\frac{2(a^2 - b_2^2)}{aw}\right)\right] \quad (3)$$

Figure 4:
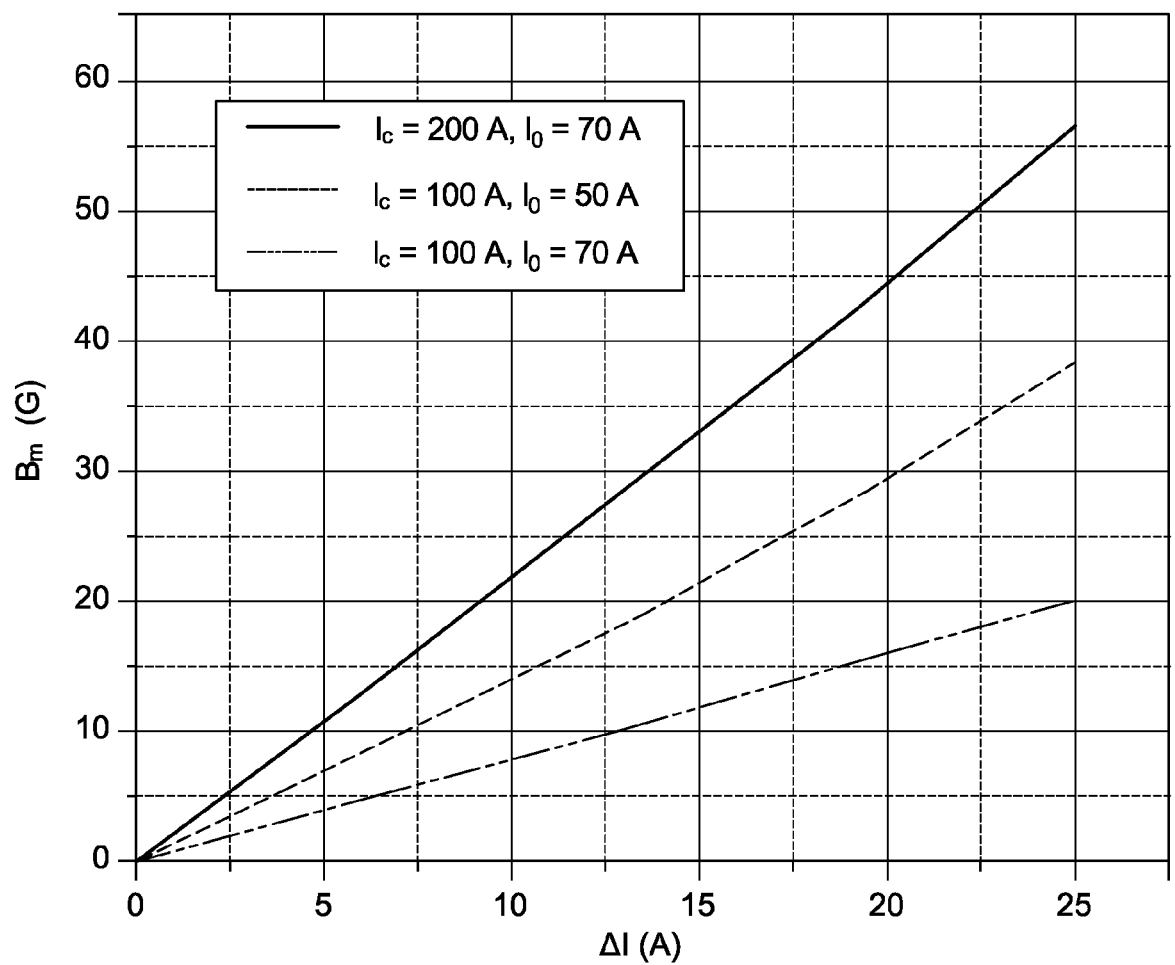
FIG. 4 is a graph of relative change in magnetic field strength within the gap defined between the two superconductive segments of FIGS. 2, 3A & 3B for various current imbalances, and various critical quench currents $I_c$, in accordance with an aspect of the present invention.

FIG. 4 graphically illustrates results of a simulation of magnetic field induction using equation (3) above and realistic conductor parameters. As illustrated, FIG. 4 plots the differential magnetic field ($B_m$) for different transport currents for two 5 mm wide superconductive segments separated by a 2 mm wide gap. Currents $I_0 + \Delta I$ and $I_0 - \Delta I$ are flowing in the two superconductive segments, and magnetic field induction $B_m$ at the middle line of the conductor is plotted in FIG. 4 as a function of $\Delta I$ for various initial currents $I_0$ and critical currents $I_c$. As illustrated, net magnetic field at the middle line increases nearly linearly with the non-balanced portion of the current. A smaller ratio of $I_0/I_c$ results in the higher amplitude of the magnetic field for the given, unbalanced current. For this 12 mm wide superconducting conductor, a readily detectible field of approximately 10 Gauss appears in the gap region, even for a small current imbalance (e.g., 5-10 amps).

Figure 5A:
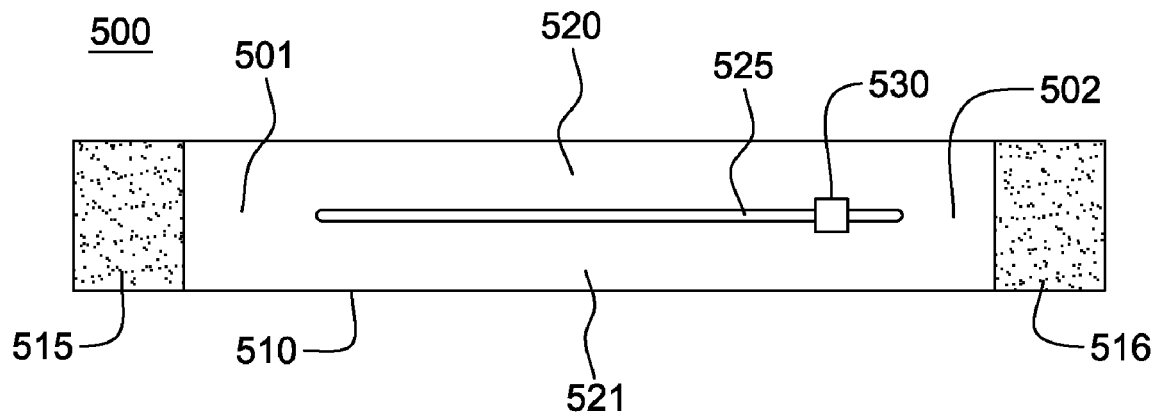
FIG. 5A is a plan view of another embodiment of a superconducting article, in accordance with an aspect of the present invention.

As validation on the concepts described herein, an experimental superconducting conductor, generally denoted 500, was produced, as illustrated in FIG. 5A. This superconducting article 500 includes a superconducting conductor 510 having first and second superconductive segments 520, 521 separated by a gap 525, aligned over which is a magnetic field sensor 530. Current leads 515, 516 electrically connect to opposite ends of superconducting conductor 510 at the first superconductive bridging section 501 and second superconductive bridging section 502. As described above, gap 525 may be formed by an elongate slit extending along the center line of superconducting conductor 510 for a substantial portion of the length of the conductor. As a specific example, in the experiment described hereinbelow, superconducting conductor 510 was a 30 cm long, 2G wire that was patterned using wet etching to form the gap along its middle line, which was approximately 1.5 mm wide and 22 cm long. A Toshiba THS116 Hall sensor was installed at the gap line, approximately 2 cm from the gap end and powered with a battery-based current source. The field sensitivity of the Hall sensor at operational conditions was 6.9 $10^{-5}$ V/Gauss.

Figure 5B:
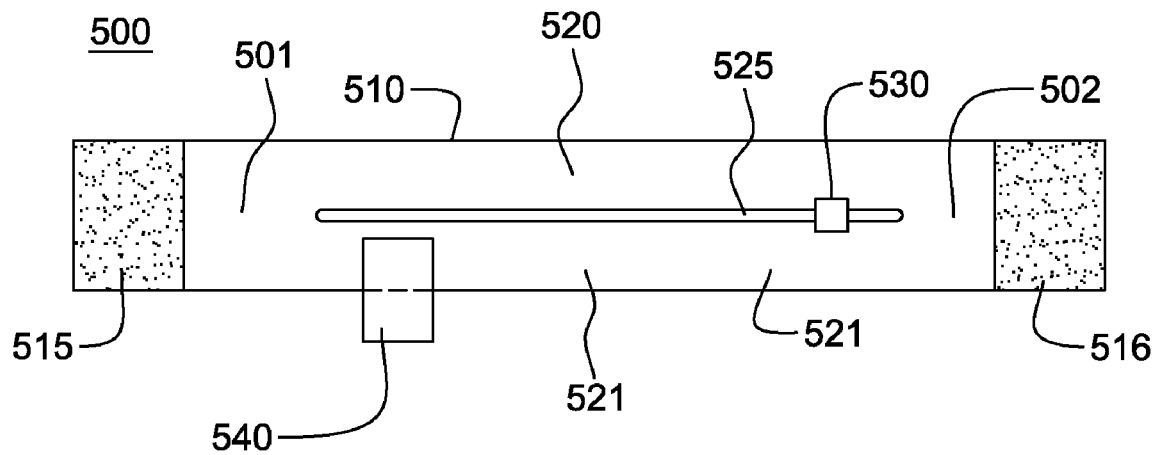
FIG. 5B is a plan view of the superconducting article of FIG. 5A, illustrating positioning of a heat source over one superconductive segment of the superconducting article, in accordance with an aspect of the present invention.

FIG. 5B depicts the superconducting article of FIG. 5A, with a heat source 540 shown positioned over a portion of second superconductive segment 521. In the experiment performed, the heat source comprised five turns of 0.4 mm Ni—Cr wire disposed approximately 8 cm from the end of the gap opposite to the end with the magnetic field sensor, and in mechanical and thermal contact with the back side of the superconducting conductor 510. In the experiment, the heat source comprised a 0.8 ohm heater powered with two heavy-duty 6 V batteries connected in parallel. The current of the heat source measured 3.8 amps, resulting in approximately 3 W of dissipated power. The superconducting article and heat source were immersed in liquid nitrogen for the experiment.

Figure 6:
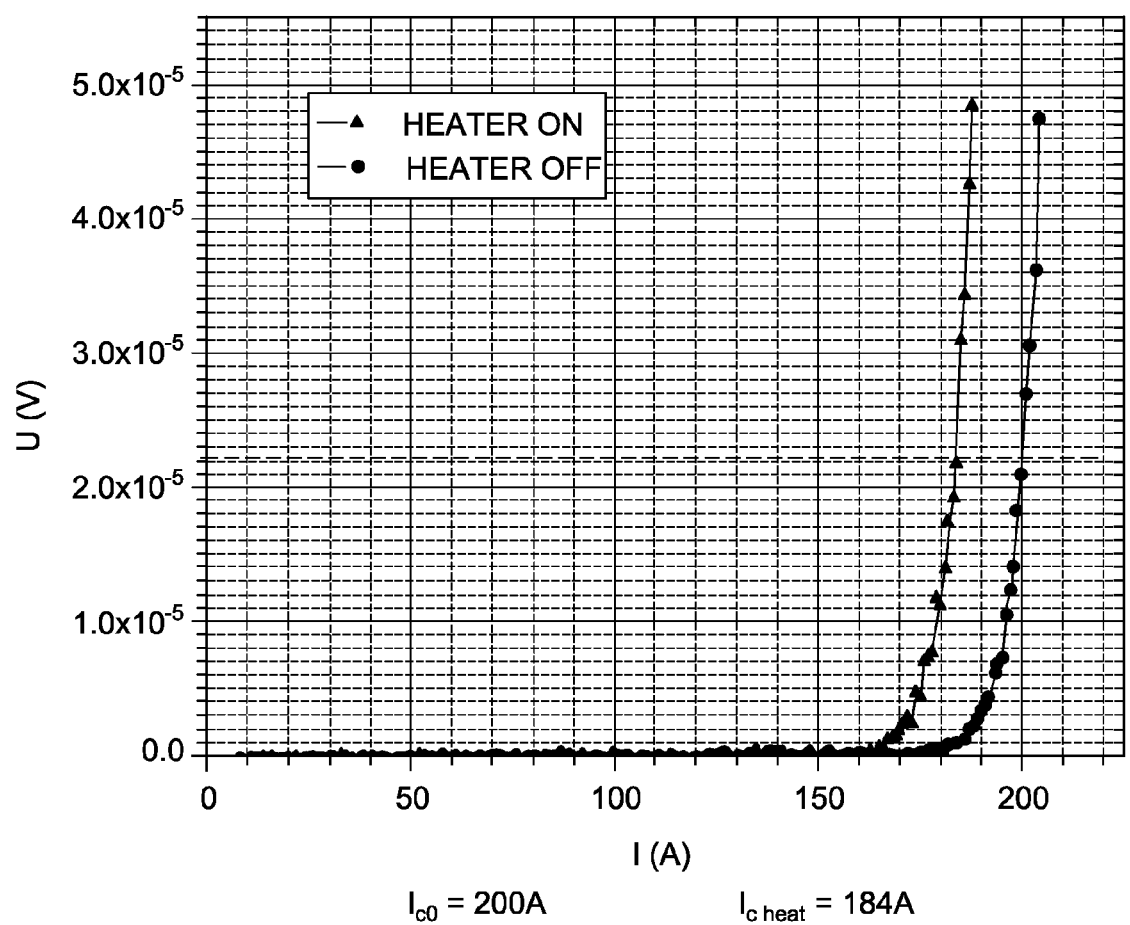
FIG. 6 is a graph of current-voltage characteristics of the superconducting conductor of the superconducting article of FIG. 5B measured with the heat source on and off, in accordance with an aspect of the present invention.

The current-voltage characteristics of the above-described superconducting article of FIGS. 5A & 5B, measured with the heat source on and off, are depicted in FIG. 6. As shown, a total reduction in the critical (quench) current through the second superconductive segment from 200 amps to 184 amps was achieved through segment heating imparted by the heat source.

Figure 7A:
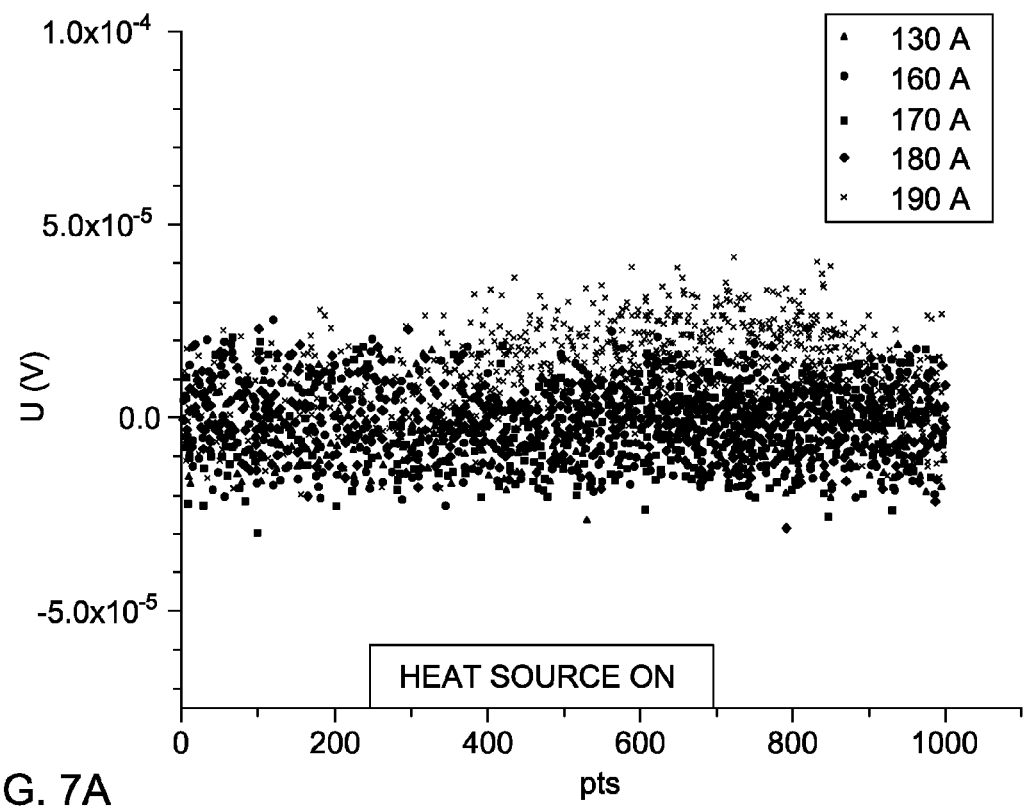
FIG. 7A is a plot of voltage points acquired before, during and after application of a heat pulse to the one superconductive segment of the superconducting article of FIG. 5B, in accordance with an aspect of the present invention.
Figure 7B:
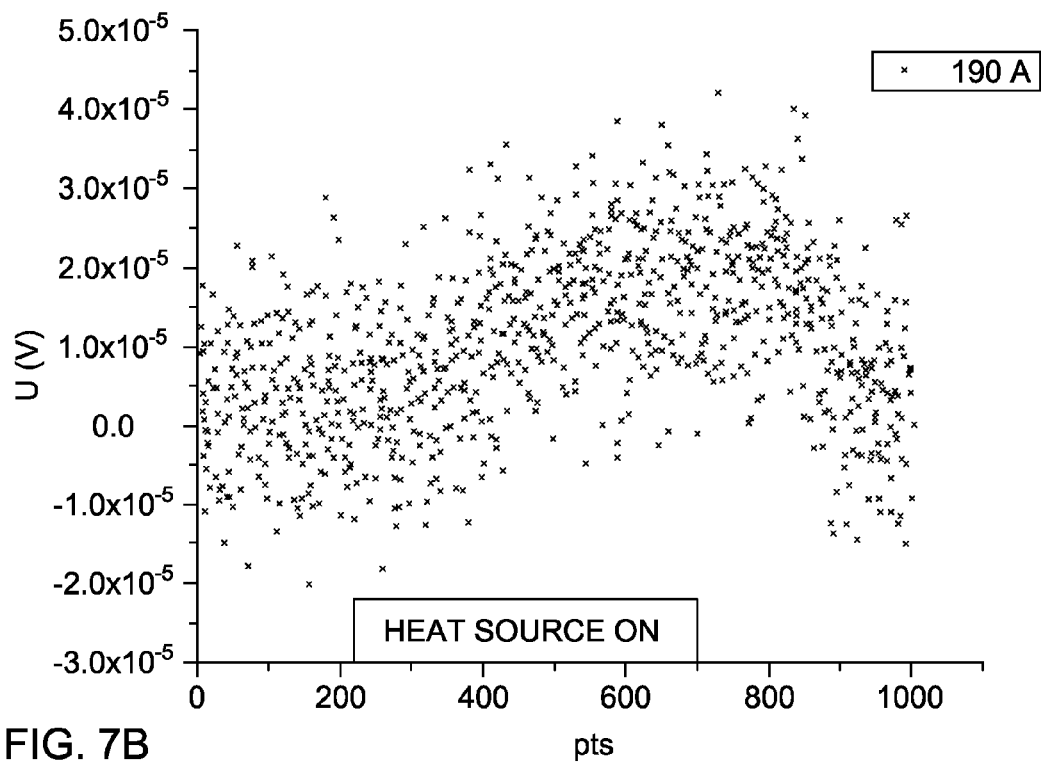
FIG. 7B is a plot of voltage points obtained for a current of 190 amps through the one superconductive segment before, during and after application of the heat pulse to the segment, in accordance with an aspect of the present invention.

For comparison, measurements of the sample voltage and Hall voltage were performed at various transport currents flowing through the superconducting conductor. Two Keitheley 2182A nano-voltmeters were used in fast-buffer acquisition mode, one for the sample voltage, and another for the Hall voltage. Both nano-voltmeters were triggered simultaneously, and 1,000 points were acquired by each, at a rate of 60 points/second. During the measurement, the heat source was turned on manually by connecting it to the battery for a time interval of approximately 4 seconds. Results of the measurement are depicted in FIGS. 7A & 7B, wherein the time collection of points is plotted against the sensed voltage for various transport currents through the conductor. As is known, if below the critical current, there should be no voltage across the conductor during superconducting state. At all current levels up to approximately 180 amps, no voltage was detected. At 190 amps, however, a voltage was detected, as illustrated in FIG. 7B. This voltage was detectable since the current at this level had gone above the critical current of the heated superconductive segment.

Figure 8:
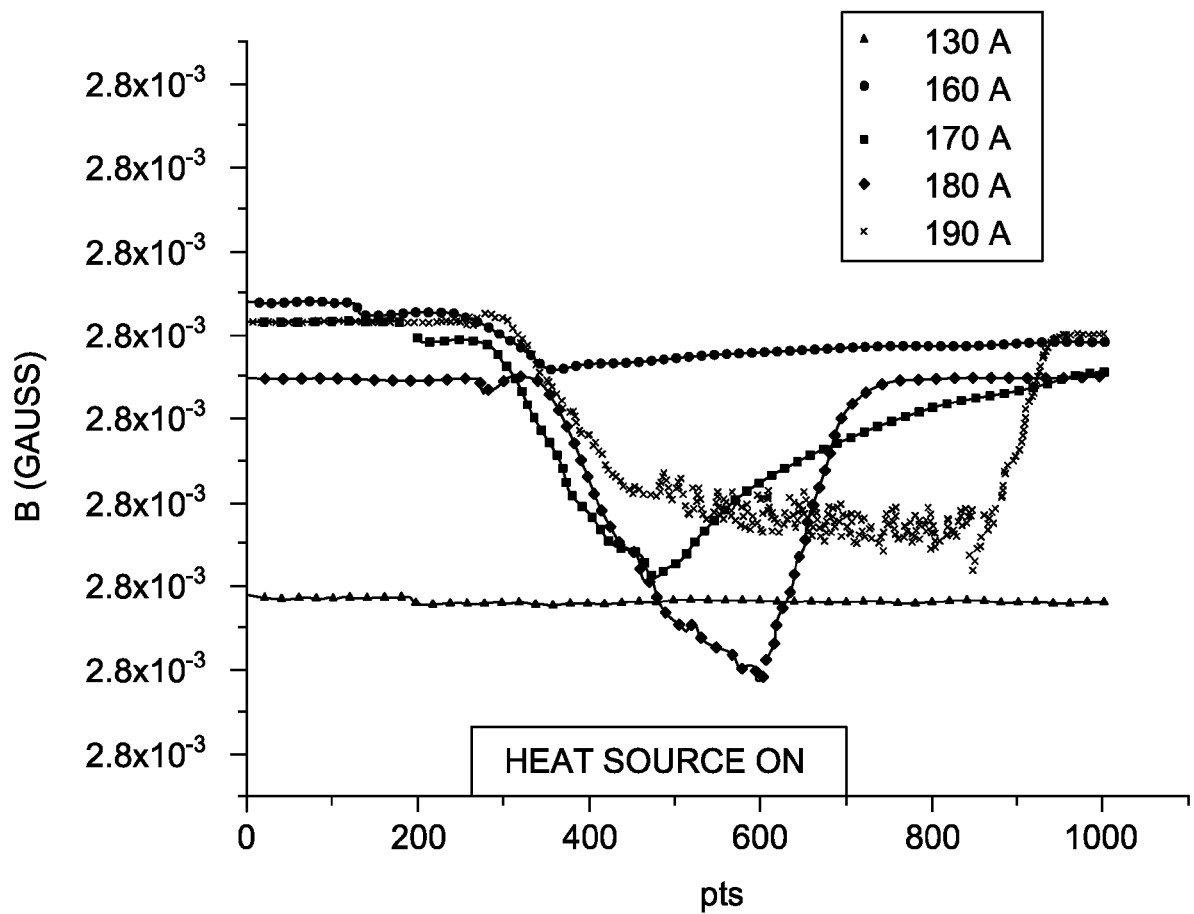
FIG. 8 is a graph of magnetic field induction at the gap between superconductive segments measured simultaneously with voltage drop across the superconductive segments, and illustrating that the effect of selective heating of the superconductive segment is readily detected, even at current levels well below the critical quench current of the segment, in accordance with an aspect of the present invention.

Simultaneous with acquiring the voltage points, net magnetic field induction in the gap was measured, the results of which are depicted in FIG. 8. In FIG. 8, there is an initial field level depicted which is due to the unsubstracted offset of the Hall sensor. As illustrated in FIG. 8, the effect of heating on the superconductive segment is clearly detectable, even at current levels well below the critical (quench) current $I_c$. More particularly, while voltage across the conductor is observed only after the net transport current is above the critical current of the conductor, a non-balanced, perpendicular magnetic field in the gap region appears as soon as the current redistribution begins, that is, significantly 15-20% below the critical current $I_c$ of the conductor. Moreover, due to the low signal-to-noise ratio, fast detection of a fault condition based on voltage detection would be very challenging, while using magnetic field sensing as disclosed herein is much easier. In fact, the signal-to-noise ratio of a magnetic field detection approach appears to be at least 100 times better than that of a voltage detection approach. This offers a significant advantage for early quench (that is, actually, prequench) detection before any voltage is detected or even before any significant heat is released in the superconductor.

To summarize, a novel approach for early quench detection (or more generally, early detection of degradation of one or more superconducting characteristics), in 2G superconductors is presented herein. In one implementation, a continuous conductor modification (i.e., slitting) along a portion of the length of the conductor is employed, along with a magnetic field sensor as a field balance detector. As noted, a pre-quench condition characterized by a localized thermal degradation of critical current of the conductor is detectable using this arrangement. Sensitivity of the technique is hundreds of times superior to a standard voltage detection scheme, and its ability to detect pre-quench degradation of a superconducting characteristic(s) of the conductor is believed unique.

Figure 9A:
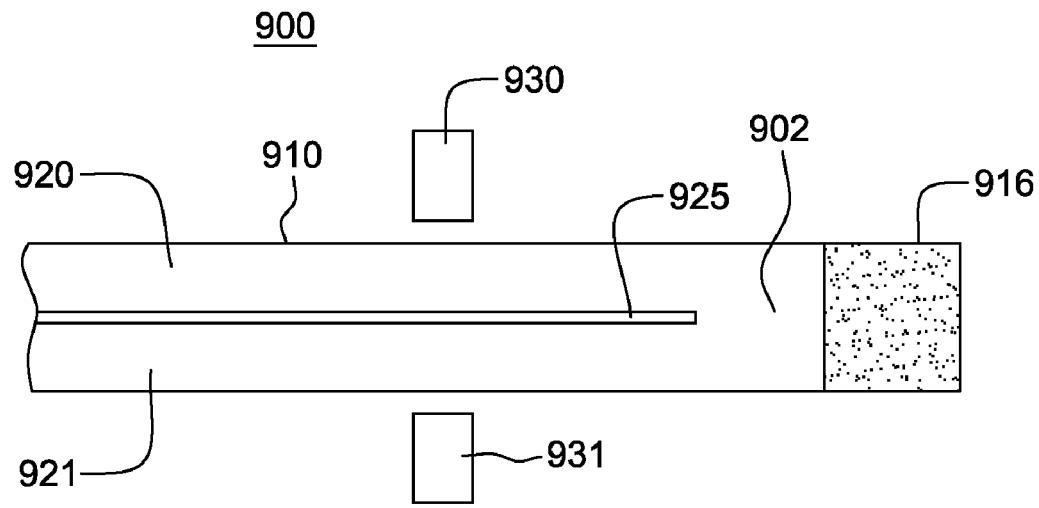
FIGS. 9A & 9B illustrate another embodiment of a superconducting article, wherein multiple magnetic field sensors are employed to achieve differential magnetic field sensing, in accordance with an aspect of the present invention.
Figure 9B:
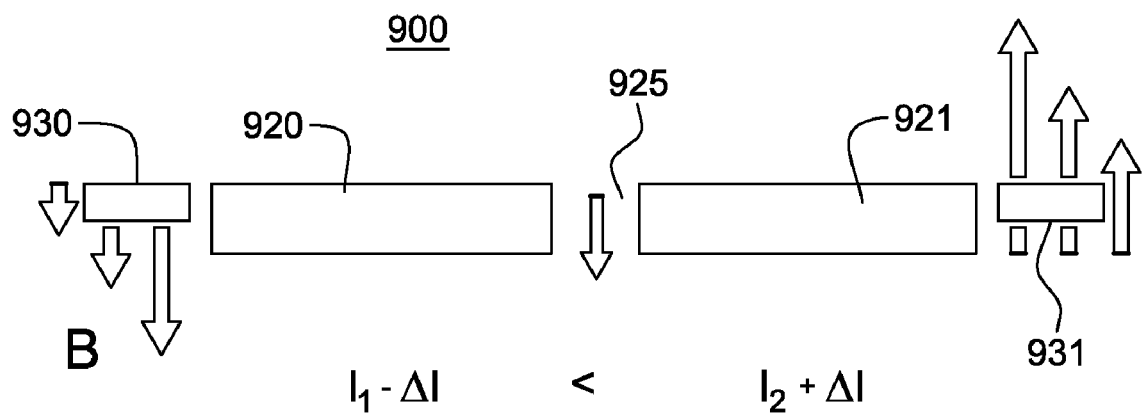

FIGS. 9A & 9B depict an alternate embodiment of a superconducting article 900, in accordance with an aspect of the present invention. In this embodiment, superconducting article 900 includes a superconducting conductor 910 that has been segmented employing a longitudinally-extending gap 925 into a first superconductive segment 920 and a second superconductive segment 921. As shown, gap 925 does not extend the full length of superconducting conductor 910, leaving a superconducting bridge section 902 at the depicted end of the conductor adjacent to a current lead 916. In this embodiment, the superconducting article comprises multiple magnetic field sensors, that is, a first magnetic field sensor 930 and a second magnetic field sensor 931. These sensors, which may be identical sensors, are positioned along a common, transverse line to the superconducting conductor 910 at the outside edges of the superconducting conductor. In one embodiment, magnetic field sensors 930, 931 may comprise the same type of sensor as used in the above-described embodiment when positioned over the gap between superconductive segments. Magnetic field sensors 930, 931, in one embodiment, could be connected to a differential amplifier and a processor for automated detection of a difference between the outputs of the sensors, e.g., in order to provide feedback to a system operator. Note that any change in the magnetic field differential from a normal reference point may be detected as representative of degradation of one or more current characteristics through one of the superconductive segments. In one embodiment, there is continuous sensing of the magnetic fields at the edges of the conductor for early detection of any magnetic field differential change.

In the example of FIG. 9B, there is an assumption that a quench region has developed within first superconductive segment 920, hence current through first superconductive segment 920 decreases by $\Delta I$, and increases through second superconductive segment 921 by the same $\Delta I$. This results in a lower magnetic field being sensed by first magnetic field sensor 930, than sensed by second magnetic field sensor 931. The detected differential between the sensors is representative (in this case) of development of a quench region (or hot-spot) within the first superconductive segment. Note that this magnetic field differential also means that there is a magnetic field in gap 925, as illustrated in FIG. 9B.

Figure 10:
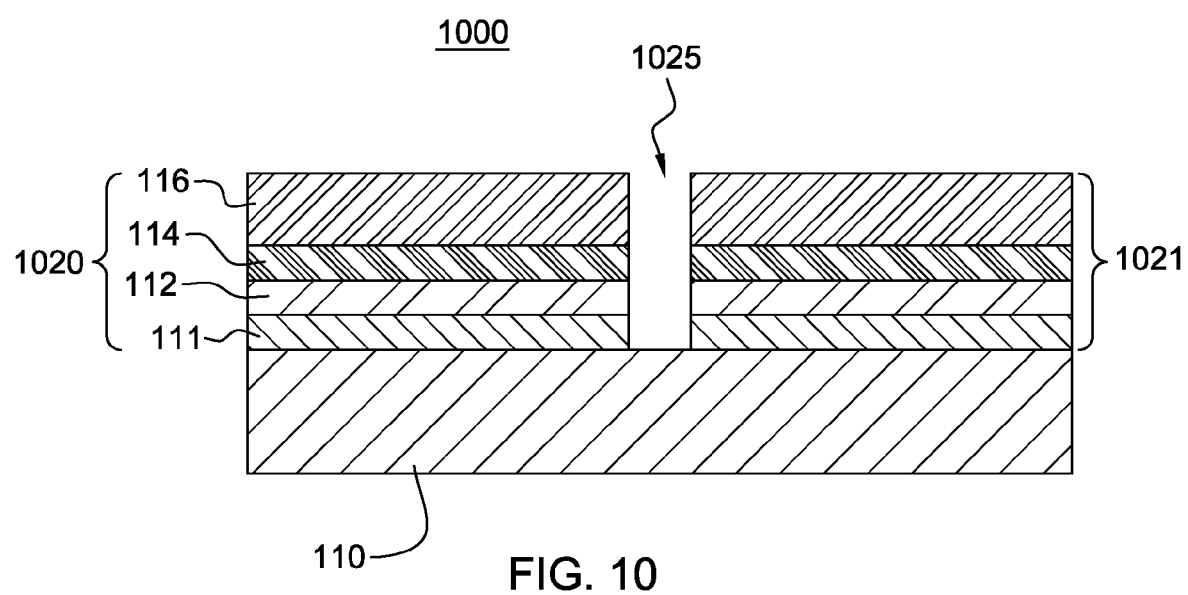
FIG. 10 is a cross-sectional elevational view of the superconducting article of FIG. 2, taken along line 10-10, and showing the superconducting conductor with a slit formed through the superconducting region thereof to define the first superconductive segment and the second superconductive segment, in accordance with an aspect of the present invention.

FIG. 10 illustrates one cross-sectional embodiment of a superconducting conductor 200 of FIG. 2, taken along line 10-10 thereof, and formed of the superconducting conductor layers depicted in FIG. 1. As illustrated, an elongate gap or slit 1025 has been defined by any appropriate means along the center line of the superconducting tape assembly of FIG. 1 down to substrate 110. This results in two distinct superconducting regions 1020, 1021, referred to herein as a first superconductive segment and a second superconductive segment. Advantageously, by leaving underlying substrate 110 intact, mechanical strength of the resultant superconducting conductor is maintained. Further, by selectively forming the elongate gap in the superconducting conductor of FIG. 1, it is possible to readily leave superconducting bridge sections in place adjacent to the current leads, as described above.

Figure 11:
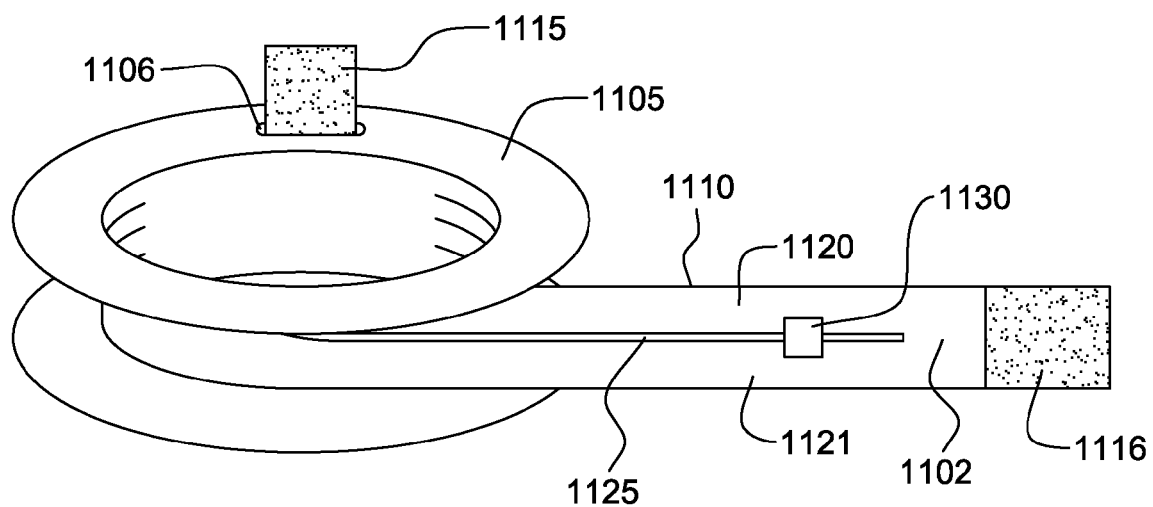
FIG. 11 is a perspective view of a superconducting article comprising a solenoid and magnetic field sensor, in accordance with an aspect of the present invention.

In a further embodiment, a superconducting article 1100 may be provided comprising a coil structure such as depicted in FIG. 11. In this embodiment, a superconducting conductor 1110, which is wound around a spool 1101, includes an elongate, longitudinally-extending gap 1125 within the conductor, which defines a first superconductive segment 1120 and a second superconductive segment 1121. A magnetic field sensor 1130 is shown disposed centered over gap 1125 in order to sense presence of the magnetic field within the gap, as described above. In this embodiment, the sensor is depicted near a superconductive bridge section 1102 connected to a current lead 1116. The other current lead 1115 is shown extending through a slot 1106 in spool 1105.

Figure 12:
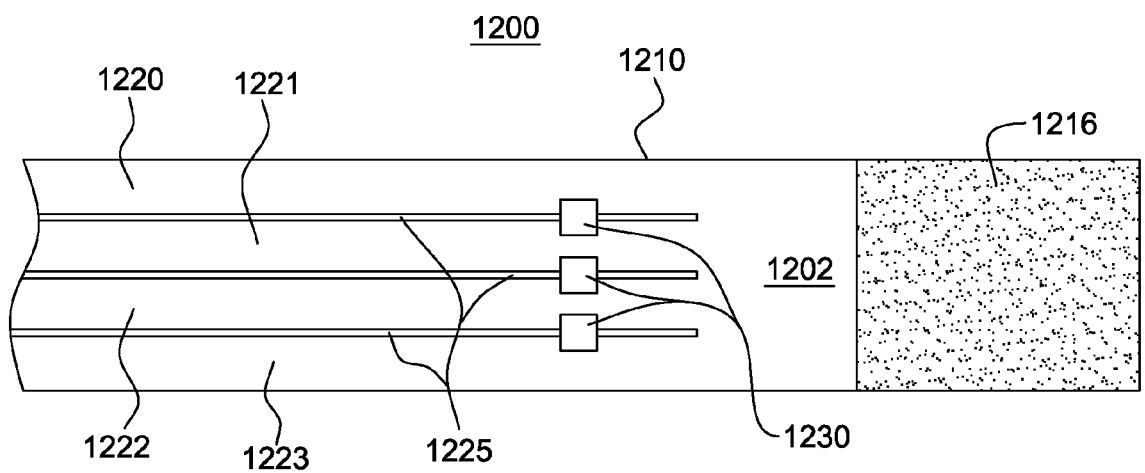
FIG. 12 depicts another embodiment of a superconducting article comprising a multi-filamentary superconducting conductor with a plurality of magnetic field sensors aligned over the gaps defined between adjacent pairs of superconducting segments, in accordance with an aspect of the present invention.

FIG. 12 depicts a further superconducting article 1200 implementation, in accordance with an aspect of the present invention. As illustrated, superconducting article 1200 includes a multifilamentary superconducting conductor 1210 sub-divided into four equal-width segments (comprising a first superconductive segment 1220, a second superconductive segment 1221, a third superconductive segment 1222, and a fourth superconductive segment 1223) by three elongate gaps 1225 formed longitudinally within the conductor. In this embodiment, a magnetic field sensor array is employed comprising three magnetic field sensors 1230 disposed near one end of gaps 1225 adjacent to superconducting bridge section 1202 coupled to current lead 1216. In the multichannel field balance detector array illustrated, spatial resolution across the conductor width is much improved, allowing for a further boost in sensitivity and detection of even smaller regions of thermal $I_c$ degradation within the 2G conductor.

Figure 13:
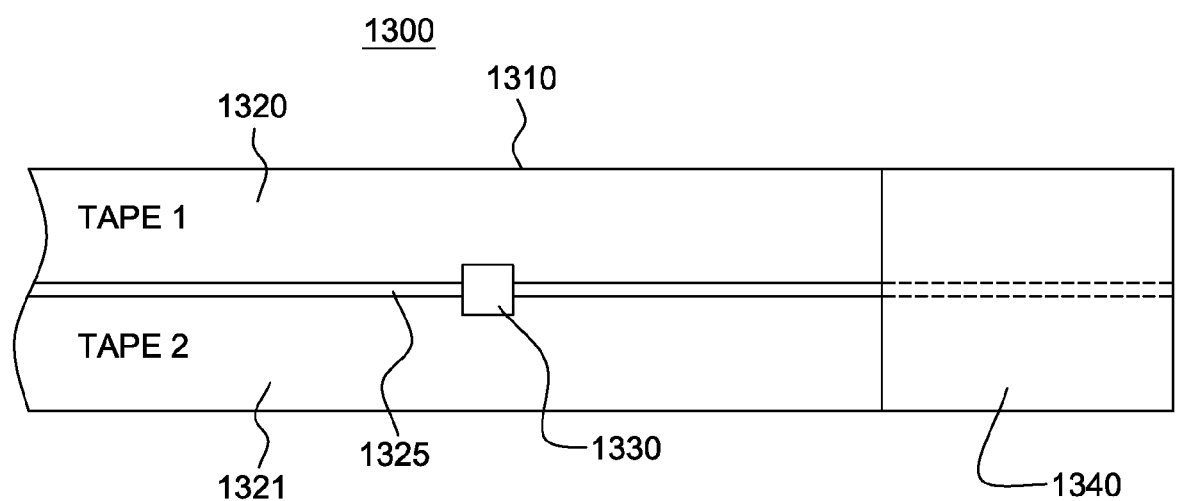
FIG. 13 depicts a further embodiment of a superconducting article comprising a hybrid superconducting conductor which includes conventional low-resistance end sections electrically interconnected via multiple superconductive segments, each of which may comprise a separate superconducting conductor (or tape), in accordance with an aspect of the present invention.

FIG. 13 depicts another variation of a superconducting article 1300, in accordance with an aspect of the present invention. In this implementation, a first superconducting conductor (or tape) 1320 is disposed adjacent to a second superconducting conductor (or tape) 1321 in spaced, opposing relation such that a gap 1325 is formed between the conductors. First superconducting conductor 1320 and second superconducting conductor 1321 are assumed to be separately manufactured superconductors, which are brought together, for example, by disposing the superconductors on a common substrate (not illustrated). A magnetic field sensor 1330 is disposed over the elongate gap between the superconducting conductors. Additionally, low-resistance bridge connections 1340 are provided, one at each end of the superconducting conductors to electrically connect the superconducting conductors together. In one embodiment, low-resistance bridge connection 1340 is formed of a low-resistivity material, such as copper or silver. Alternatively, low-resistance bridge connection 1340 could be fabricated of a superconducting material. However, due to the presence of an electrical contact interface, there is inherently a resistance in the structure, even with the use of a superconducting bridge connection. Although quench detection sensitivity will be lower with an arrangement such as FIG. 13, it is still possible to detect presence of a quench condition within one of the superconducting conductors. In this implementation, one skilled in the art would balance bridge connection resistivity with the desired resistivity level to be monitored for a quench region within one of the conductors.

Figure 14:
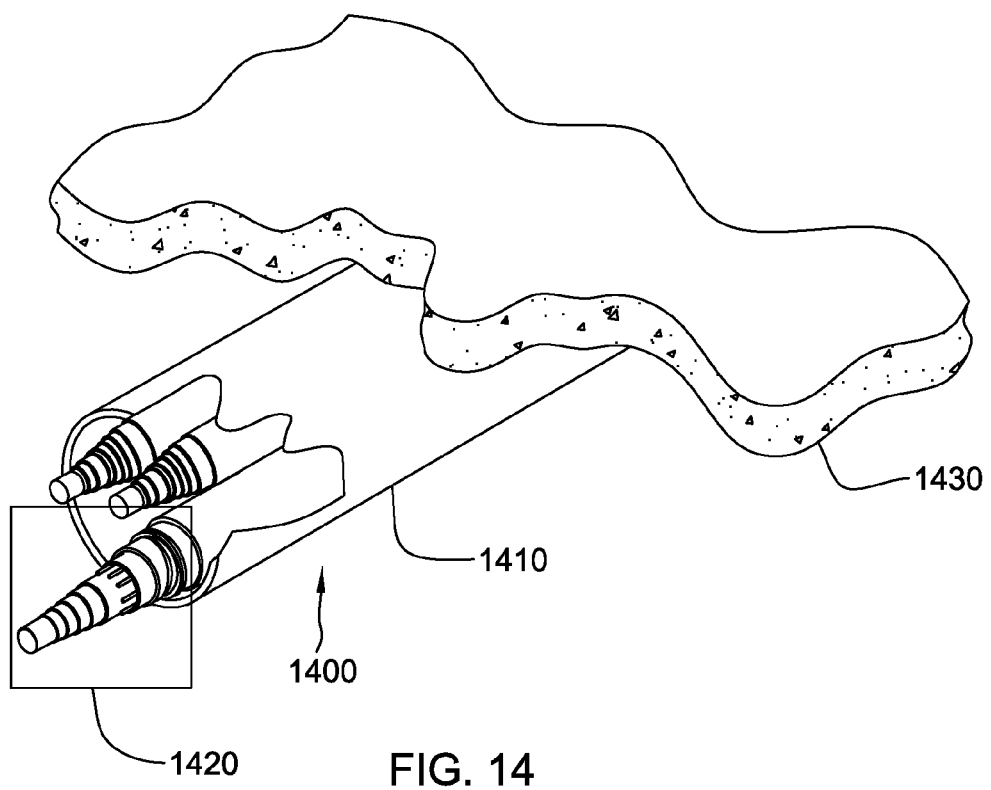
FIG. 14 is a partial cross-sectional view of one embodiment of a superconducting article comprising a power cable, in accordance with an aspect of the present invention.
Figure 15:
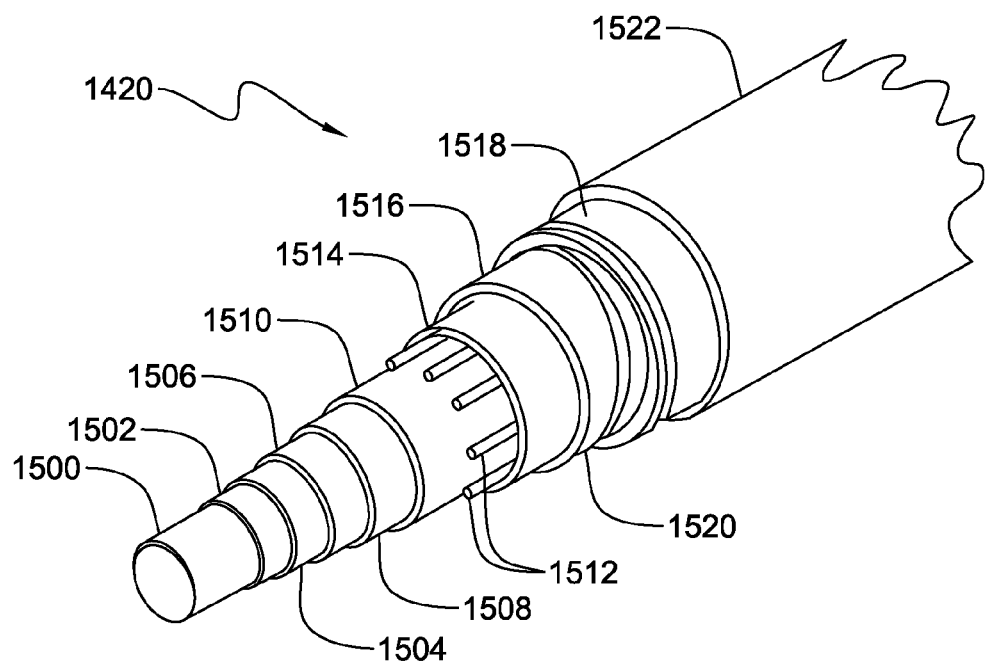
FIG. 15 is a more detailed embodiment of the superconducting article of FIG. 14, in accordance with an aspect of the present invention.
Figure 16:
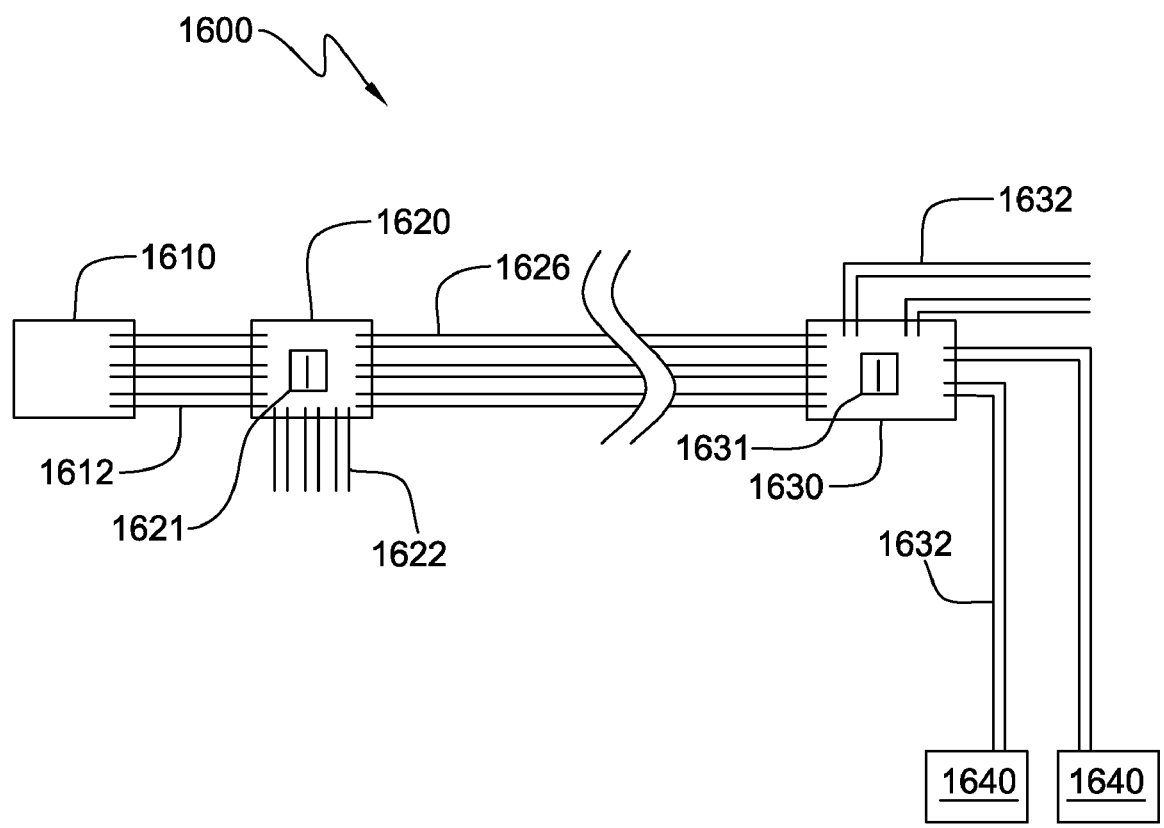
FIG. 16 illustrates one embodiment of a superconducting article comprising a power grid, in accordance with an aspect of the present invention.

Various additional superconducting article configurations are depicted in FIGS. 14-16, and described below. The superconducting conductor and field sensor embodiments presented herein may be employed in one or more of these articles.

FIGS. 14 and 15 illustrate implementation of a superconducting article such as described herein within a power cable 1400. FIG. 14 illustrates several power cables 1420 extending through an underground conduit 1410, which may be a plastic or steel conduit, and illustrates ground 1430 for clarity. As is shown, several power cables 1420 may run through conduit 1410.

FIG. 15 depicts a particular structure of a power cable 1420. In order to provide cooling to maintain the superconductive power cable in a superconducting state, liquid nitrogen is fed through the power cable through LN2 duct 1500. One or a plurality of HTS tapes 1502 is/are provided so as to cover the duct 1500. The tapes may be placed onto the duct 1500 in a helical manner, spiraling the tape about the duct 1500. Further components include a copper shield 1504, a dielectric tape 1506 for dielectric separation of the components, a second HTS tape 1508, a copper shield 1510 having a plurality of centering wires 1512, a second, larger LN2 duct 1514, thermal insulation 1516, provided to aid in maintaining a cryogenic state, a corrugated steel pipe 1518 for structural support, including skid wires 1520, and an outer enclosure 1522.

Turning to FIG. 16, a basic schematic of a power grid 1600 is provided. Fundamentally, power grid 1600 includes a power plant 1610, typically housing a plurality of power generators, and transmission lines 1612, to deliver power to a transmission substation 1620. Transmission substation 1620 contains generally a bank of step-up power transformers 1621, which are utilized to step-up voltage of the generated power. Typically, power is generated at a voltage level on the order of thousands of volts, and the transmission substation functions to step-up voltages to the order of 100,000 to 1,000,000 volts in order to reduce line losses. Typical transmission distances are on the order of 50 to 1,000 miles, and power is carried along those distances by power transmission cables 1622, 1626. Power transmission cables 1622, 1626 are routed to a plurality of power substations 1630 (only one of which is shown in FIG. 16). The power substations contain generally a bank of step-down power transformers 1631, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 1632 to end users 1640, which include commercial end users as well as residential end users. It is also noted that individual transformers may be locally provided for individual or groups of end users. According to a particular feature, at least one of the generators provided in the power plant, the transformers in the transmission substation, the power transmission cable, the transformers provided in the power substation, and the power distribution cables contain a superconducting conductor and field sensor, in accordance with the present description.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A superconducting article comprising:
a first superconductive segment and a second superconductive segment; and
at least one magnetic field sensor disposed to monitor relative change in strength of a net magnetic field comprising a first magnetic field generated by a first current passing through the first superconductive segment superposed with a second magnetic field generated by a second current passing through the second superconductive segment, wherein relative change in strength of the net magnetic field indicates degradation of at least one superconducting characteristic of one of the first superconductive segment or the second superconductive segment.

2. The superconducting article of claim 1, wherein the first superconductive segment and the second superconductive segment are disposed is spaced, parallel relation with a gap defined therebetween, and degradation of the at least one superconducting characteristic comprises degradation of a critical quench current of one of the first superconductive segment or the second superconductive segment.

3. The superconducting article of claim 2, wherein the first superconductive segment and the second superconductive segment are of substantially equal width.

4. The superconducting article of claim 2, wherein the at least one magnetic field sensor is disposed to monitor relative change in strength of the net magnetic field compared in the gap defined between the first superconductive segment and the second superconductive segment.

5. The superconducting article of claim 1, wherein an increase in strength of the net magnetic field indicates formation of at least one quench region within the first superconductive segment or the second superconductive segment.

6. The superconducting article of claim 1, further comprising multiple magnetic field sensors disposed to monitor relative change in strength of the first magnetic field compared with strength of the second magnetic field.

7. The superconducting article of claim 1, further comprising a superconducting conductor, the superconducting conductor comprising the first superconductive segment and the second superconductive segment, and further including a first superconductive bridge section and a second superconductive bridge section, the first superconductive bridge section and the second superconductive bridge section being electrically interconnected by the first superconductive segment and the second superconductive segment, wherein the first superconductive segment and the second superconductive segment are disposed in spaced, parallel relation.

8. The superconducting article of claim 7, wherein the first superconductive segment and the second superconductive segment are defined by an elongate slit extending longitudinally within a portion of the superconducting conductor, wherein the elongate slit extends through a superconducting region of the superconducting conductor, to define the first superconductive segment and the second superconductive segment, but not through a substrate of the superconducting conductor.

9. The superconducting article of claim 1, further comprising a high-temperature superconducting (HTS) conductor, the HTS conductor comprising the first superconductive segment and the second superconductive segment, and wherein a relative change in strength of the net magnetic field indicates change in a critical current of one segment of the first superconductive segment or the second superconductive segment, the indication being obtained prior to quenching of the one segment.

10. The superconducting article of claim 1, further comprising a superconducting conductor, the superconducting conductor comprising the first superconductive segment and the second superconductive segment, and being wound into a coil, and wherein the at least one magnetic field sensor is disposed adjacent to at least one end of the wound coil.

11. The superconducting article of claim 1, further comprising a hybrid conductor, the hybrid conductor comprising the first superconductive segment and the second superconductive segment and further including a first low-resistance end section and a second low-resistance end section, the first low-resistance end section and the second low-resistance end section being electrically interconnected by the first superconductive segment and the second superconductive segment.

12. A superconducting article comprising:
a plurality of superconductive segments; and
at least one magnetic field sensor disposed to monitor relative change in strength of magnetic fields generated by current passing through respective superconductive segments of the plurality of superconductive segments, wherein a relative change in magnetic field strength of current passing through one superconductive segment compared with at least one other superconductive segment indicates degradation of at least one superconducting characteristic of the one superconductive segment or the at least one other superconductive segment.

13. The superconducting article of claim 12, wherein relative change in magnetic field strength of the one superconductive segment compared with the at least one other superconductive segment indicates degradation of a critical current of the one superconductive segment or the at least one other superconductive segment, wherein degradation of the critical current signals possible formation of at least one quench region associated with the one superconductive segment or the at least one other superconductive segment.

14. The superconducting article of claim 12, further comprising multiple magnetic field sensors disposed to monitor relative change in strength of magnetic fields produced by current passing through respective superconducting segments of the plurality of superconductive segments.

15. The superconducting article of claim 12, wherein the plurality of superconductive segments are disposed in spaced, parallel relation, with adjacent superconductive segments having a gap defined therebetween, and wherein the superconductive segments of the plurality of superconductive segments are of substantially equal width, and the at least one magnetic field sensor is disposed to monitor relative change in strength of magnetic fields in at least one gap defined between at least two adjacent superconductive segments of the plurality of superconductive segments.

16. The superconducting article of claim 12, further comprising a superconducting conductor, the superconducting conductor comprising the plurality of superconducting segments, and further including a first superconductive bridge section and a second superconductive bridge section, the first superconductive bridge section and the second superconductive bridge section being electrically interconnected by the plurality of superconductive segments, wherein the plurality of superconducting segments are disposed in spaced, parallel relation.

17. The superconducting article of claim 16, wherein the plurality of superconductive segments are defined by multiple elongate slits extending longitudinally within a portion of the superconducting conductor, the multiple elongate slits extending through a superconducting region of the superconducting conductor to define the plurality of superconductive segments, but not through a substrate of the superconducting conductor.

18. The superconducting article of claim 12, further comprising a superconducting conductor, the superconducting conductor comprising the plurality of superconductive segments, and being wound into a coil, and wherein the at least one magnetic field sensor is disposed adjacent to at least one end of the wound coil.

19. A method of fabricating a superconducting article, comprising:
forming a superconducting conductor, the superconducting conductor comprising a first superconductive segment in spaced, opposing relation to a second superconductive segment, with a gap defined therebetween; and
disposing at least one magnetic field sensor adjacent to the superconducting conductor to monitor relative change in strength of a net magnetic field comprising a first magnetic field generated by a first current passing through the first superconductive segment superposed with a second magnetic field generated by a second current passing through the second superconductive segment, wherein relative change in strength of the net magnetic field indicates degradation of at least one superconducting characteristic of one of the first superconductive segment or the second superconductive segment.

20. The method of claim 19, wherein forming the superconducting conductor further comprises providing the first superconductive segment and the second superconductive segment with an equal width, and the disposing comprises disposing the at least one magnetic field sensor in the gap defined between the first superconductive segment and the second superconductive segment, and wherein degradation of the at least one superconducting characteristic comprises degradation of a critical quench current of one of the first superconductive segment or the second superconductive segment.

21. The method of claim 19, wherein forming the superconducting conductor comprises forming an elongate slit extending longitudinally within a portion of the superconducting conductor to define the first superconductive segment and the second superconductive segment, the elongate slit extending through a superconducting region of the superconducting conductor, to define the first superconductive segment and the second superconductive segment, but not through a substrate of the superconducting conductor, and wherein the forming results in the superconducting conductor having a first superconductive bridge section and a second superconductive bridge section which are electrically interconnected by the first superconductive segment and the second superconductive segment.

* * * * *